US005329262A

United States Patent [19]

Fisher, Jr.

[11] Patent Number: 5,329,262

[45] Date of Patent: Jul. 12, 1994

[54] FIXED RF CONNECTOR HAVING INTERNAL FLOATING MEMBERS WITH IMPEDANCE COMPENSATION

[75] Inventor: Robert L. Fisher, Jr., Palmyra, Pa.

[73] Assignee: The Whitaker Corporation, Wilmington, Del.

[21] Appl. No.: 989,457

[22] Filed: Dec. 9, 1992

Related U.S. Application Data

[63] Continuation of Ser. No. 720,123, Jun. 24, 1991, abandoned.

[51] Int. Cl.[5] .......... H01P 1/04; H03H 7/38

[52] U.S. Cl. .......... 333/33; 333/360; 439/247; 439/248

[58] Field of Search .......... 333/33, 34, 260; 439/247, 248, 252, 675; 174/88 C

[56] References Cited

U.S. PATENT DOCUMENTS

| | | | |
|---|---|---|---|
| 2,540,012 | 1/1951 | Salati | 333/260 |
| 3,323,083 | 5/1967 | Ziegler, Jr. | 333/260 |
| 3,325,752 | 6/1967 | Barker | 333/34 |
| 3,350,666 | 10/1967 | Ziegler, Jr. | 333/33 |
| 3,437,960 | 4/1969 | Ziegler, Jr. | 333/260 |
| 3,439,294 | 4/1969 | Flanagan et al. | 333/33 |
| 3,460,072 | 8/1969 | Ziegler, Jr. | 333/33 |
| 3,492,605 | 1/1970 | Ziegler, Jr. | 333/33 |
| 3,559,112 | 1/1971 | Ziegler, Jr. | 333/33 |
| 3,566,334 | 5/1971 | Ziegler, Jr. | 439/248 |
| 4,227,765 | 10/1980 | Neumann et al. | 439/248 |
| 4,697,859 | 10/1987 | Fisher, Jr. | 439/246 |
| 4,708,666 | 11/1987 | Fisher, Jr. | 439/580 |
| 4,789,351 | 12/1988 | Fisher, Jr. et al. | 439/248 |
| 4,824,399 | 4/1989 | Bogar et al. | 439/578 |
| 4,861,271 | 8/1989 | Bogar et al. | 439/63 |
| 4,917,630 | 4/1990 | Hubbard | 439/675 X |

OTHER PUBLICATIONS

AMP Catalog 80-570; "Guide to RF Connectors", pp. 4 to 13, 103, 106, 107; May 1990; AMP Incorporated, Harrisburg, PA.

*Primary Examiner*—Benny Lee

*Attorney, Agent, or Firm*—Eric J. Groen; Anton P. Ness

[57] ABSTRACT

An RF coaxial connector is disclosed which has an internally floating member which allows both ends of the coaxial connection to remain fixed, with the floating section compensating for any necessary axial or radial float. The floating section includes a pin and socket connection where the pin and socket section has various regions of intentional impedance mismatch. The geometries of the pin and socket are specifically designed such that the reflections are substantially self cancelling at all frequencies and at all various longitudinal positions between the pin and socket section.

19 Claims, 9 Drawing Sheets

FIXED RF CONNECTOR HAVING INTERNAL FLOATING MEMBERS WITH IMPEDANCE COMPENSATION

This application is a continuation of application Ser. No. 07/720,123 filed Jun. 24, 1991, now abandoned.

BACKGROUND OF THE INVENTION

1. Field of the Invention

The subject invention relates to an electrical RF connector where the plug and jack and their associated conductors can be fixed, while at the same time the internal structure of the connector assembly can float. The plug connection has intentional mismatches in impedance to provide self-cancelling reflections irrespective of the axial float, minimizing power loss due to reflection.

2. Description of the Prior Art

Typical RF coaxial connection systems are cable-to-cable assemblies and comprise a plug and jack where one of the connectors, most likely the jack is a fixed connector. The cable entering the jack is fixed relative to the jack and the jack would be fixedly mounted to a panel. The mating connector or plug would have an outer shielding shell which would be fixedly mounted to a panel, whereas the center conductor would be spring loaded and permitted to float in relationship to the outer shell.

It is also known from U.S. Pat. No. 4,697,859 to fixedly mount the jack within a rack, whereas the plug is spring loadably mounted to a panel. The entire plug member including the conductive shroud, the center conductor and the coaxial cable can float to accommodate the axial and radial misalignment.

There is a need within the industry, however, to have both halves of the connector fixed, that is, where the jack half has its conductive shroud and center conductor fixed relative to a first panel, and where the plug half has its conductive shroud and center conductor fixed relative to a second panel. In commercially available product which is of the type in which the conductive shroud and center conductor of both the jack and the plug are fixed to respective panels, the plug and jack are designed to have matched or balanced impedances when they are fully mated, and the accommodation to tolerance mismatch is taken up by simply allowing the pin to not fully mate.

However, in the section where it is not fully mated, there is a high degree of impedance mismatch, resulting in substantial power loss due to the reflected signal. As the length of impedance mismatch changes due to the extent of mating, the electrical performance is either improved or degraded; if the degree of unmating increases, the performance worsens; whereas, if the connectors are further mated, the performance increases. It should be appreciated then that in a rack and panel system having a plurality of such connectors, the degree of unmatedness would vary with each connector pair due to the varying axial tolerances between the associated pairs.

It is an object of the invention then to provide an electrical connector assembly where both halves of the coaxial pair are fixed, yet where the connector pin can float to accommodate for axial and radial tolerance mismatch.

It is a further object of the invention to provide an electrical connector assembly where the floating of the connector pair self compensates for impedance mismatch throughout the various flotation positions, such that the electrical performance of the connector pair is high.

Other objects and advantages of the invention will be apparent from the following description, the accompanying drawings and the appended claims.

SUMMARY OF THE INVENTION

The objects of the invention were accomplished by providing a coaxial connector assembly matable at a mating face with a complementary mating coaxial connector, and containing a coaxial connection comprising pin and socket terminals at an internal mated interface, where the pin terminal is mounted by a dielectric body coaxially within an outer conductive shell or outer conductor which extends forwardly beyond the dielectric body to define a shroud-receiving end containing a conductive ring to define a smaller inner diameter forwardly of the dielectric body, all defining a first subassembly and where the socket terminal is held within an outer conductive sleeve by way of a dielectric sleeve, all defining a second subassembly, where the outer conductive sleeve is movably connected to the outer conductive shell proximate the mating face of the connector. The outer conductive sleeve has a conductive shroud having resilient fingers adapted for coaxial engagement within the conductive ring. The pin terminal is coaxially positioned within the conductive shroud when mated with the socket. The connection is characterized in that various regions of mismatched impedances are positioned intermediate the dielectric body and the dielectric sleeve, the lengths of the regions varying with the axial position of the pin relative to the socket, the regions being adapted to create reflection signals at transition positions between adjacent regions, where the reflection signals are substantially self cancelling in summation, thereby preventing power loss. Upon mating with a mating coaxial connector, the second subassembly is moved toward the first subassembly and against spring bias, so that the socket terminal is moved further toward the pin terminal at the internal mated interface to another particular axial position, which modifies the lengths of the regions; however, irrespective of the particular axial position of the pin and socket terminals, the net effect of the mismatched impedances still approximates the nominal impedance of the coaxial circuit.

In another aspect of the invention an RF coaxial connector comprises a conductive member having inner and outer conductive shrouds at opposite ends of a conductive tubular member. Each conductive shroud is integrally connected to the tubular member and extends outwardly to an inner end at the internal mating interface and an outer end at the connector mating face. A dielectric sleeve is inserted within the conductive member, where the sleeve comprises a tubular body adapted for slidable receipt within the conductive tubular member. The sleeve has a first or inner end face positioned internally of the conductive member and spaced inwardly of the inner end at the internal mated interface, thereby forming an annular opening within the inner conductive shroud, intermediate the inner end face of the dielectric sleeve and the inner mating face. The dielectric sleeve further comprises an inner passageway extending from the inner end face to a second or outer end face proximate the mating face of the connector. An electrical socket terminal is affixed in the passageway, the terminal comprising an inner socket portion positioned adjacent to the inner end face of the dielectric portion, and an outer socket member positioned coaxially of the outer conductive shroud proximate the connector mating face. A rear conductive sleeve is adapted to overlappingly electrically engage the inner conductive shroud in slidable engagement therewith at the internal mated interface. An electrical pin terminal is mounted in a rear dielectric body, the pin terminal having an intermediate section of enlarged diameter extending forwardly from the dielectric sleeve, and a forward reduced diameter pin contact section adapted to electrically connect with the inner socket portion. The reduced diameter portion is coaxially positioned within the inner conductive shroud, an intersection of the enlarged diameter intermediate section and the reduced diameter portion being positioned within the inner conductive shroud, positioning a portion intermediate section of the enlarged diameter intermediate section and a portion of the reduced diameter portion within the annular opening, and positioning a portion of the enlarged diameter intermediate section within the rear conductive sleeve. The conductive member is longitudinally movable relative to the electrical pin terminal thereby moving the intersection relative to the inner conductive shroud. In this manner, the pin member can remain fixed such as by the first subassembly including the rear conductive sleeve, rear dielectric body and the pin terminal being affixed to an electrical article.

PREFERRED EMBODIMENT OF THE INVENTION

In FIGS. 1 to 6 the elements identified by the same numeral are generally the same element among the Figures unless otherwise noted herein.

Figure 1:
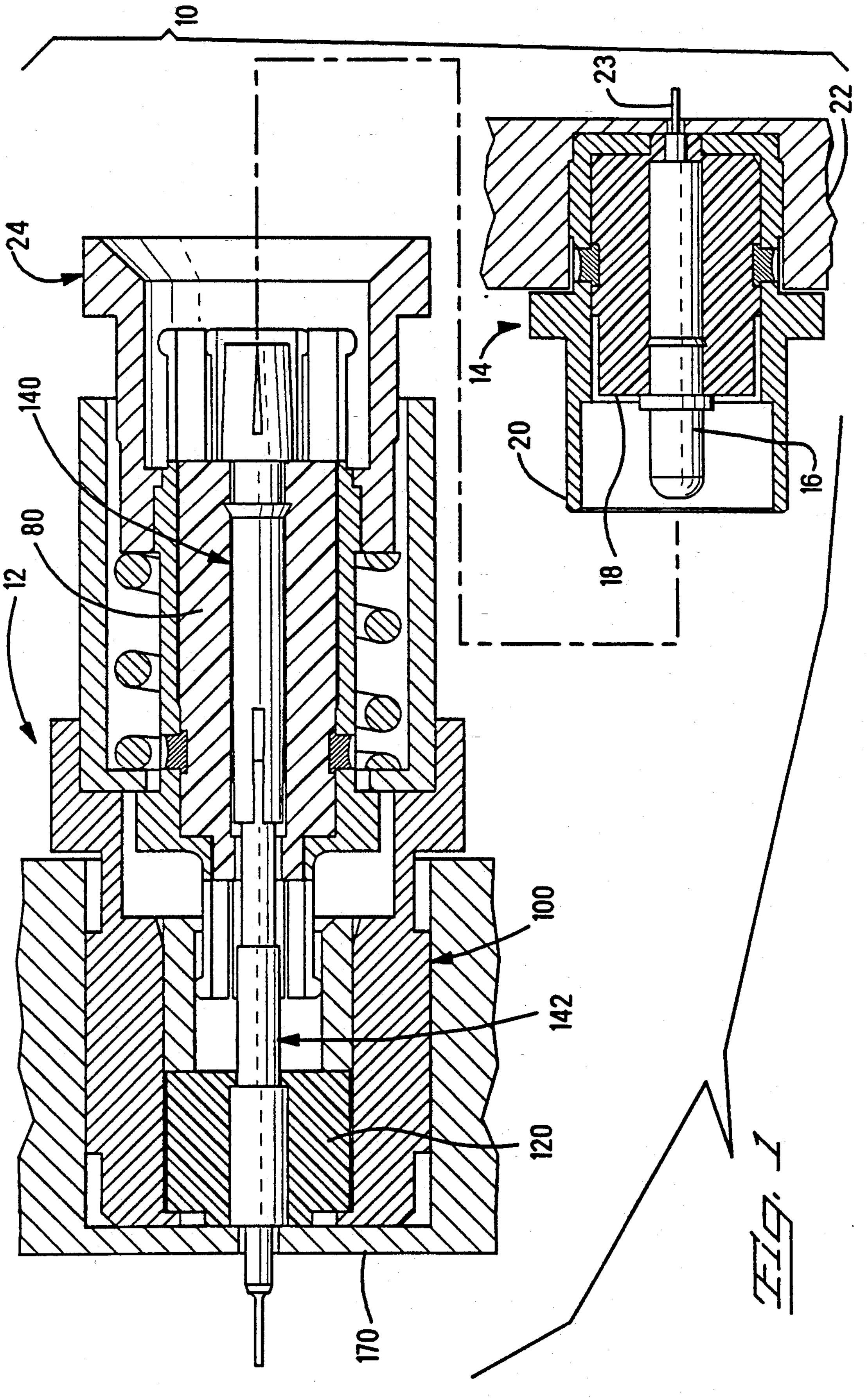
FIG. 1 is a cross-sectional view of the plug and jack connector which make up the coaxial connection of the preferred embodiment.

Referring first to FIG. 1 and to a preferred embodiment of a 2.8 mm coaxial connector employing the features of the invention in a "blind-mate" application, the connector assembly is shown at 10 comprising a plug half 12 and a jack half 14, which when mated define a coaxial circuit between electrical apparati and having a nominal impedance such as commonly 50 ohms. The plug 12 and jack 14 would be incorporated into a rack and panel system of the type shown, for example, in U.S. Pat. No. 4,697,859. Plug 12 is shown having a socket member 140 and pin member 142 mounted in dielectric sleeve 80 and inner dielectric member 120 respectively, which are in turn mounted within front and rear conductive members 24,142; and plug 12 is secured within panel 170.

The jack 14 is of conventional construction having a central pin conductor 16 mounted within a dielectric body 18 and an exterior conductive shroud 20, where the pin 16 and dielectric body 18 are retained within the shroud 20, the entire assembly being fixedly mounted within a panel 22. A small diameter pin 23 is integral to the pin 16 and is therefore fixed relative to the dielectric body 18 and to the conductive shroud 20. In the preferred embodiment of the invention, the pin 16 conductor is brass, the dielectric body 18 is PTFE, and the exterior conductive shroud 20 is beryllium copper.

Figure 2:
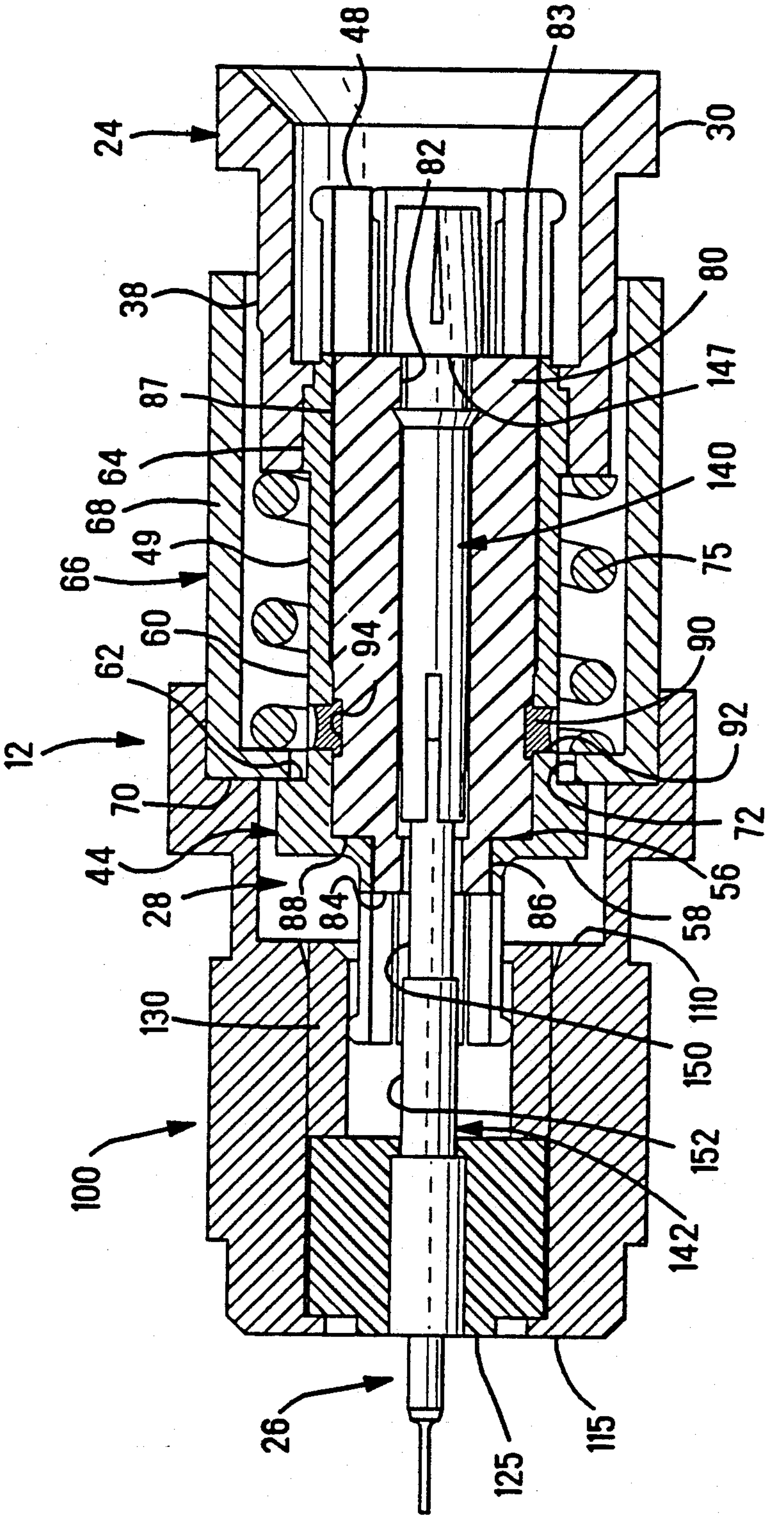
FIG. 2 is a cross-sectional view similar to that of FIG. 1, showing only the plug connector.

With reference now to FIG. 2, the plug half 12 is shown as having a front mating portion 24, a rear mating portion 26 and a self-compensating section 28. The front mating portion 24 is adapted for mating engagement with the jack 14, whereas the rear mating portion 26 is interconnectable with a stripline interconnection, as is well known in the art.

Figure 3:
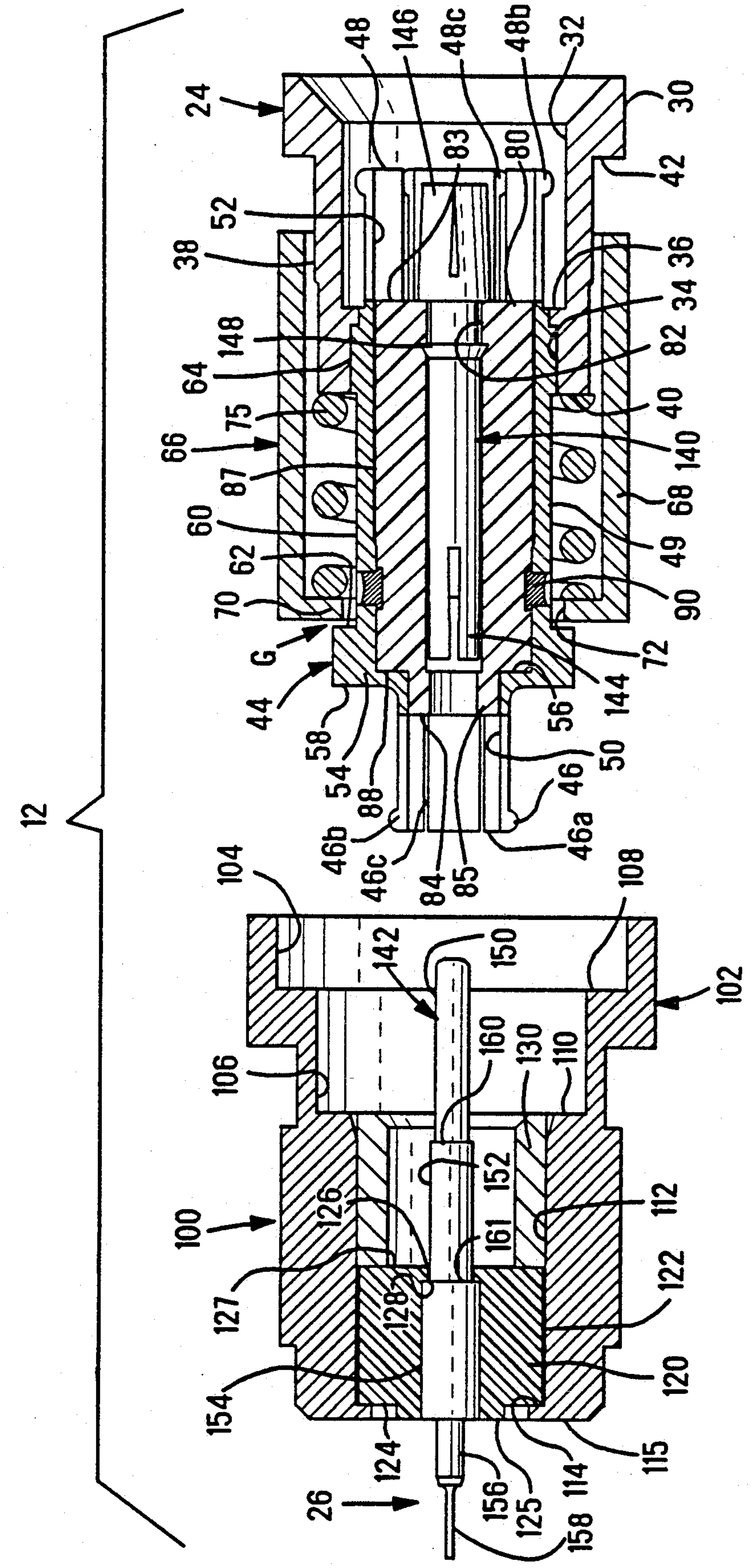
FIG. 3 is a cross-sectional view similar to that of FIG. 2, showing the plug connector partially dismantled, showing the self-compensating section in greater detail.

With reference now to FIG. 3, the front mating portion 24 is comprised of an exterior conductive shroud portion 30, preferably made of beryllium copper, having a forward inner diameter 32, a rearward inner diameter 34, and a medially positioned step section 36. The exterior conductive shroud 30 further includes an outer peripheral surface 38 having a distal tip 40, and an inner lip 42.

The plug half 12 further comprises an inner conductive body 44 having conductive shroud sections 46 and 48 extending from opposite ends of a tubular body portion 49, where each of the shrouds has spring contact fingers **46*b* and 48*b*, as shown in FIG. 3, defined by separations 46*c* and 48*c* in the shrouds. In the preferred embodiment of the invention, the conductive body 44 is made of beryllium copper. The tubular body portion 49 has a minor inner diameter 50 adjacent to the conductive shroud 46 and a major inner diameter 52 which extends forwardly from a transition section 54 adjacent to the conductive shroud 46. The transition section 54 defines an inner forwardly facing surface 56 and an outer rearwardly facing surface 58. The tubular body portion 49 has a reduced outer diameter section 60 inwardly positioned of the transition section 54, thereby forming a forwardly facing shoulder 62. An annular rib 64 surrounds the tubular body portion 49 adjacent to the conductive shroud 48, thereby providing a collar onto which the exterior conductive shroud 30** is press fit.

With reference FIGS. 2 and 3, the plug half 12 includes an annular spring retaining cap 66 having an outer skirt 68 and an end plate 70, the end plate 70 having a circular opening 72 therethrough. The circular opening 72 is large enough for slidable receipt over the annular rib 64, yet small enough that the end plate 70 can abut the shoulder 62 of the conductive body 44, as shown in FIG. 2. A compression spring 75 is trapped between the end plate 70 of the retaining cap 66 and the distal tip 40 of the exterior conductive shroud 30, as shown in FIG. 3.

With reference still to FIGS. 2 and 3, the plug half 12 further includes a cylindrical dielectric sleeve 80, preferably made of PTFE, having a central through passage 82, extending between a front surface 83 and a rear surface 84. The sleeve 80 also includes a reduced diameter section 85, thereby defining an outer annular surface 86. The sleeve 80 further includes an enlarged outer diameter 87 with an intermediate end face 88 positioned between surface 86 and diameter 87. It should be appreciated that the sleeve 80 is suitably adapted for insertion within the conductive body 44, such that the outer annular surface 86 and the outer diameter 87 are slidably received against respective diameters 50 and 52, and with end face 88 in abutment with surface 56. The sleeve 80 is retained in position within the conductive tubular body 49, by an epoxy 90 which is injected through openings 92 of the conductive body 44, thereby permeating into the annular groove 94 within the outer diameter 87 of the dielectric sleeve 80.

As shown in FIG. 3, the plug half 12 also includes a rear conductive member 100, preferably made of stainless steel, comprising a front flange section 102, having first and second inner diameters 104 and 106, where the intersection of the diameters 104, 106 defines forwardly facing surface 108. The conductive member 100 also includes a forwardly facing rear surface 110 which is continuous with an inner diameter 112, the inner diameter 112 extending from the rear surface 110 to an end face 114, the end face 114 being proximate to an outer end surface 115 of the conductive member 100.

An inner dielectric member 120, preferably made of PTFE material, has an outer diameter 122 for slidable receipt within the rear conductive member 100, within the inner diameter 112. The dielectric member 120 has an outer surface 124 adapted for abutment against the end face 114 of the rear conductive member 100. This positions an end surface 125 (FIG. 2) in a planar relation with the outer end surface 115 of the conductive member 100. A lip 126 is located adjacent a front face 127 of the dielectric member 120, where the lip 126 defines a rearwardly facing annular shoulder 128. A conductive ring 130 is compressively positioned against the diameter 112 of the conductive member 100, thereby retaining the dielectric member 120 against the end face 114.

The plug half 12 includes an internal floating electrical connection or internal mated interface made between a socket member 140 and a pin member 142. The socket member 140 is positioned coaxially within the tubular body portion 49 and has a first socket 144 positioned proximate to the conductive shroud 46, and a second socket 146 positioned coaxially within the conductive shroud 48. The socket member 140 is axially retained within the passage 82 by way of a barb 148 on the socket member 140.

A pin member 142, preferably of brass, is positioned within the dielectric member 120 and has a forward diameter 150, an intermediate diameter 152, and an enlarged diameter 154. A pin 156 extends from the enlarged diameter 154, and has a flattened tab portion 158 extending integrally therefrom for connection to a stripline, as mentioned above. The intersection between the diameters 150 and 152 defines a shoulder 160, whereas the intersection between diameters 152 and 154 defines a shoulder 161.

The above described plug member 12 is assembled by first inserting the dielectric member 120 into the conductive member 100, into the position where the outer surface 124 abuts the end face 114. The conductive ring 130 is then press fit into the position shown in FIG. 3, to maintain dielectric member 120 against the end face 114. The pin member 142 is then inserted through the end surface 125, (FIG. 2) until shoulder 161 abuts the annular shoulder 128 (FIG. 3). This positions the intermediate diameter 152 coaxially within the conductive ring 130, and the forward diameter 150 of pin 142 coaxially within the diameter 106.

With reference still to FIG. 3, the dielectric sleeve 80 is inserted into the conductive body 44 such that the end face 88 is in abutment with surface 56 on the conductive body 44. As mentioned above, epoxy 90 is inserted in the openings 92 and into the groove 94, thereby retaining the dielectric sleeve 80 and conductive body 44 together. The socket member 140 is then inserted into the through passage 82, until the shoulder 147 (FIG. 2) abuts surface 83 of the sleeve 80, the barb 148 retaining the socket member 140 within the passage 82 of the dielectric sleeve 80.

The retaining cap 66 is thereafter slid over the end of the conductive body 44, such that the end plate 70 abuts shoulder 62 of the conductive body 44. The compression spring 75 is then inserted within the cap 66, and the exterior conductive shroud 30 is press fit into the position shown in FIG. 3, such that the spring 75 is under slight compression. It should be appreciated, from FIG. 3, that the combination of the conductive body 44, dielectric sleeve 80, socket member 140, and exterior conductive shroud member 30 are movable together, relative to the retaining cap 66, against the force of the spring compression. The retaining cap 66 and associated assembly are thereafter inserted into the conductive member 100, such that the retaining cap 66 is press fit within the bore defined by inner diameter 104, such that the end plate 70 of the retaining cap 66 abuts the surface 108. As shown in FIG. 2, this positions the surface 58 in a spaced relation from surface 110, positions conductive shroud 46 within the conductive ring 130, and positions the forward diameter portion 150 of the pin 142 within the first socket 144. The inner surface of conductive shroud section 46 and the inner surface of conductive ring 130 can together be considered an outer conductor inner surface at the internal mated interface, with a change in diameter occurring at the leading ends of resilient fingers 46*b*.

It should be appreciated from FIG. 2 that, as assembled, the retaining cap 66 is fixed to the conductive member 100, such that movement of the exterior shroud member 30 moves the conductive body 44 and socket member 140 into various axial positions along the length of the pin 142.

Figure 4:
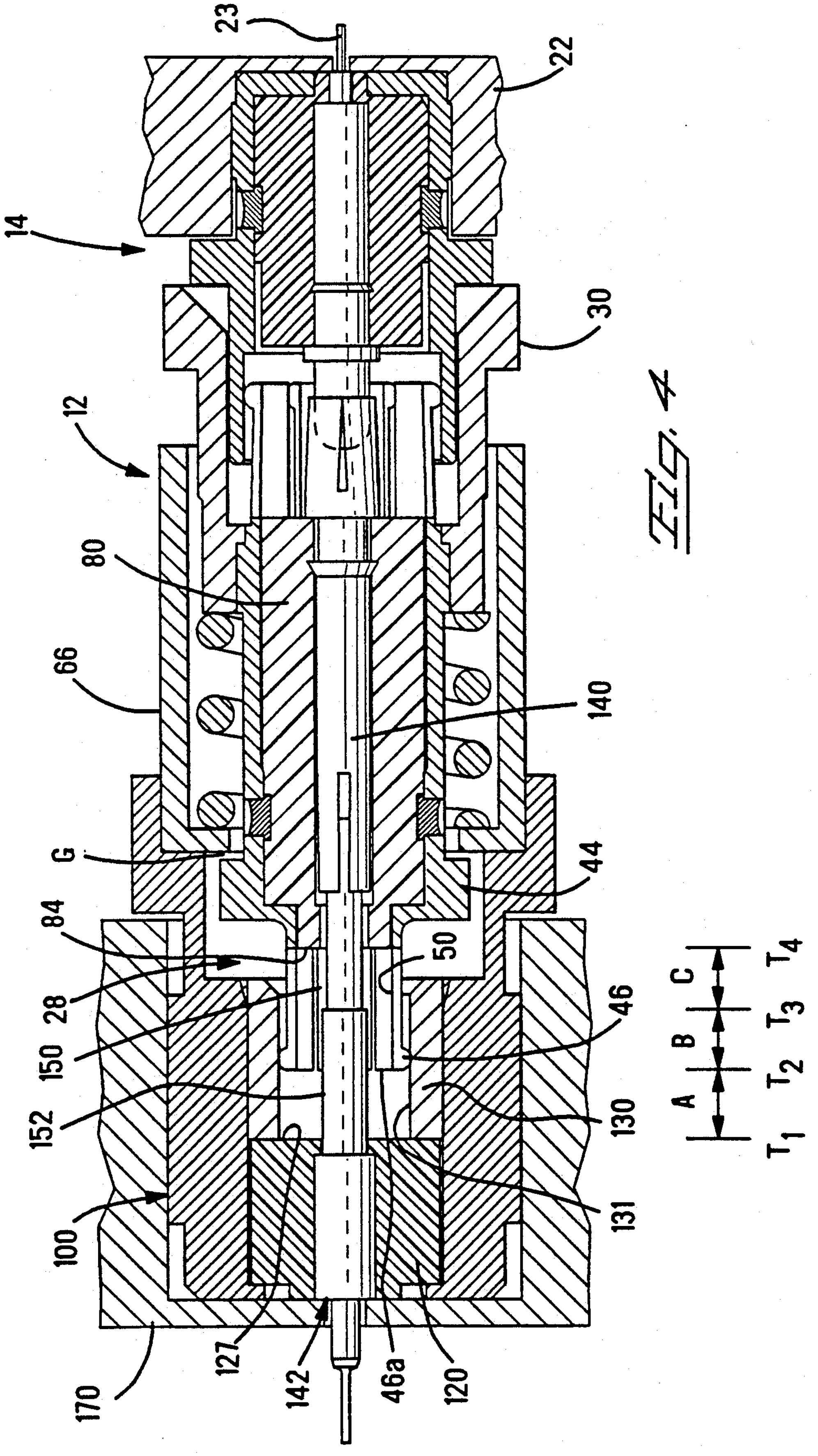
FIG. 4 is a cross-sectional view similar to that of FIG. 1, showing the plug and jack in a first extreme mated position.

With respect now to FIG. 4, the self-compensating section 28 will be described in greater detail. The impedance of any coaxial connector section is a function of the inner diameter of the outer conductor, the outer diameter of the inner conductor, and the dielectric that separate the two. As shown in FIG. 4, the self-compensating section 28 has three variable sections of impedance A, B and C defined by four transitions from impedance of one level to the impedance of another level. The section A is the distance between front face 127 of the dielectric member 120 and the front edge 46*a* of the conductive shroud 46; section B is the distance between the front edge 46*a* of the conductive shroud 46 and the shoulder 160 (FIG. 3) on the pin 142; and section C is the distance between the shoulder 160 and rear surface 84 of the dielectric sleeve 80. Thus, it should be appreciated that the sections A–C vary in length with the axial displacement of the pin 142 relative to the socket 140. The impedance through the section of the pin diameter 154 (FIG. 3) is nominally 50 ohms, as is the section of the pin member 142 and socket member 140 within the dielectric sleeve 80, as viewed in FIG. 4.

However, the sections A, B and C do not have nominal impedances of 50 ohms, but rather the impedance of sections A and C is greater than 50 ohms, whereas the impedance of section B is less than 50 ohms. The impedance of section A is a function of the diameter 152 of the pin 142, the inner diameter 131 of the conductive ring 130, and the dielectric effect of the air in between the two. The impedance of section B is a function of the diameter 152 of the pin 142, the inner diameter 50 of the conductive shroud 46, and the dielectric effect of the air in between the two. Finally, the impedance of section C is a function of the diameter 150 of the pin 142, the effective inner diameter 50 of the conductive shroud 46, and the dielectric effect of the air intermediate the two.

Figure 5:
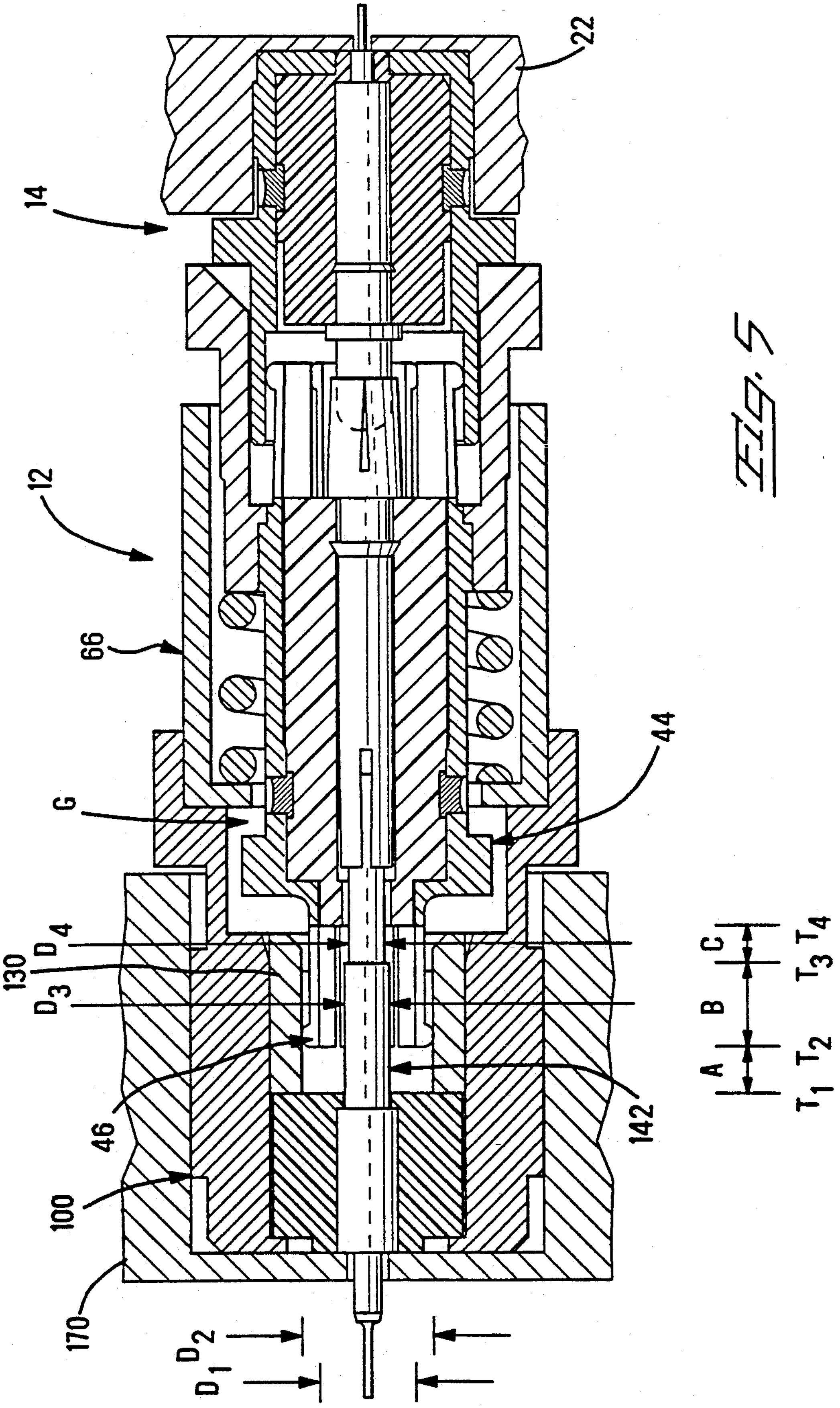
FIG. 5 is a cross-sectional view similar to that of FIG. 5, showing the plug and jack in an optimum mated position.
Figure 6:
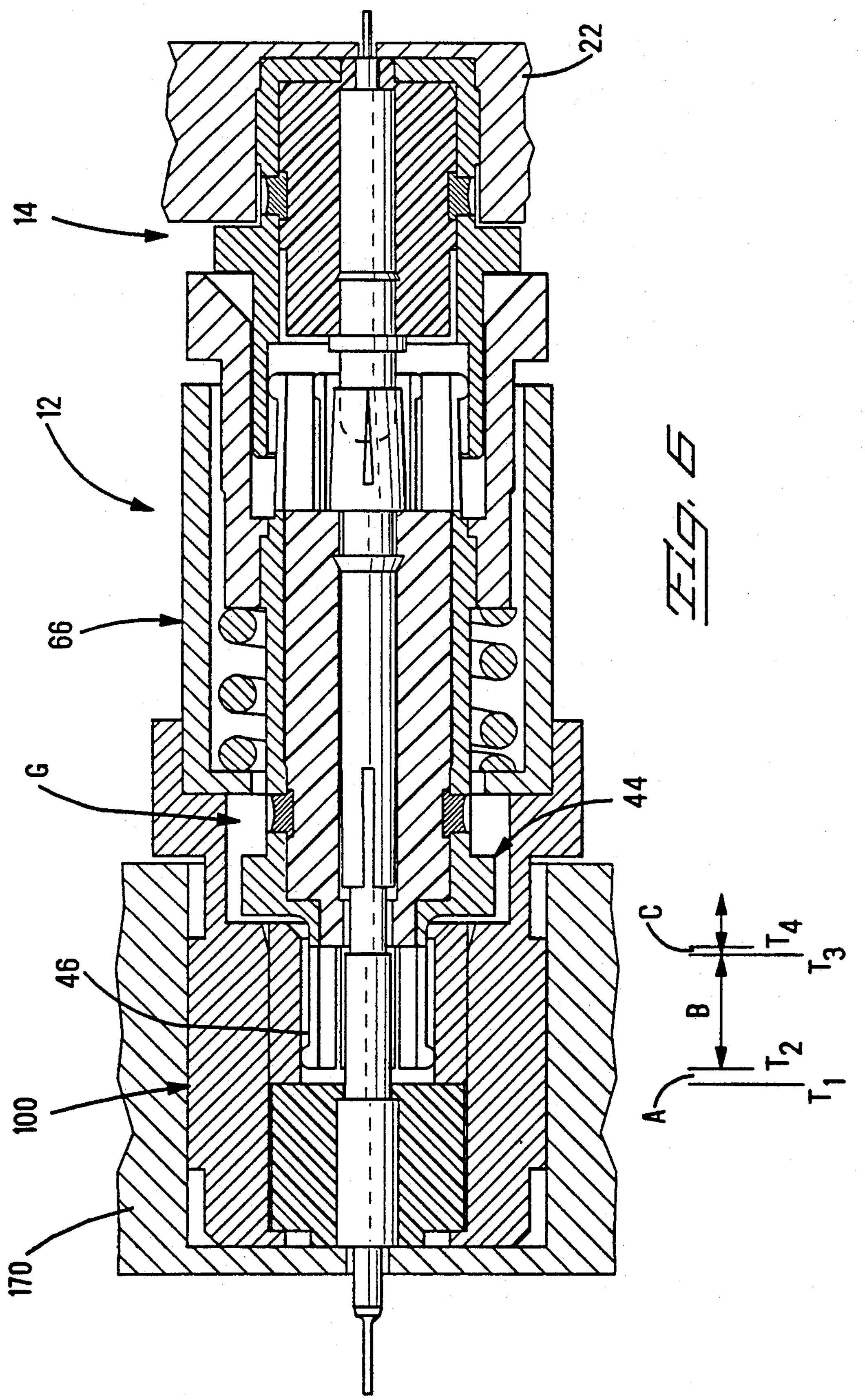
FIG. 6 is a cross-sectional view similar to that of FIGS. 4 and 5, showing the plug and jack in a second extreme mated position.

It should be appreciated then that the conductive body 44 and the socket member 140, together with the exterior conductive shroud 30, can float between the positions shown in FIGS. 4-6. The changes in diameter of the pin terminal at intersection 160 and of the outer conductive inner surface at the leading end of the conductive shroud section at leading ends 46*a* of resilient fingers 46*b* are staggered, and assuredly remain staggered at all possible axial positions resulting from mating of connectors 12 and 14. This flotation changes the lengths of the sections A-C, due to the overlapping effect of the conductive shroud 46 with the pin member 142, as shown in progression from FIGS. 4-6. The change in the length of the sections A-C does not change the magnitude of the impedance but, rather, only changes the phase angle through which the impedance operates. Four such reflections occur, one at each of the transition sections $T_1$-$T_4$, as shown in any of the attached FIGS. 4-6, due to the instantaneous change in impedance. The reflection at $T_1$ is due to the change of impedance between the nominal impedance value of 50 ohms and the impedance value of zone A, likewise the reflection at $T_4$ is due to the change of impedance between the nominal impedance value of 50 ohms and the impedance value of zone C. The reflections at $T_2$ and $T_3$ are due to the change of impedance between zones A and B, and B and C, respectively.

With reference now to FIGS. 4-6, it should be appreciated that as the jack half 14 is moved further to the left, as viewed in FIGS. 4-6, the gap G between the retaining cap 66 and the conductive body 44 increases, thereby moving the conductive shroud 46 further into the conductive ring 130. This same movement causes the length of zone B to increase, while zones A and C decrease, as shown in the progression of FIGS. 4-6. As shown in FIG. 5, the plug half 12 and jack half 14 are shown in their nominal condition where the gap is 0.020 inches, whereas FIGS. 4 and 6 show somewhat outer limits to the float, where the gap G is 0.005 inches and 0.040 inches, respectively.

As mentioned above, the plug half 12 is designed to float internally, while still keeping the reflected signal to a minimum. In the preferred embodiment of the invention, the impedance values of zones A-C are 65.87; 45.47; and 59.37 ohms, respectively. Further, in the preferred embodiment of the invention where the plug and jack preferably define a 2.8 mm coaxial connection system, the length in inches of zones A-C, in the position shown in FIGS. 4-6, are as follows:

| | Zone A | Zone B | Zone C |
|---|---|---|---|
| FIG. 4 | 0.045" | 0.040" | 0.040" |
| FIG. 5 | 0.030" | 0.055" | 0.025" |
| FIG. 6 | 0.010" | 0.075" | 0.005" |

Furthermore, in the preferred embodiment of the invention, and with reference to FIG. 5, the inner diameter ($D_1$) of the conductive shroud 46 is 0.0635 inches, the inner diameter ($D_2$) of the conductive ring 130 is 0.090 inches, the outer diameter ($D_3$) of the pin 142 at 152 is 0.029 inches, and the outer diameter ($D_4$) of the pin 142 at 150 is 0.023 inches.

As mentioned above, the movement of the conductive shroud 46 between the positions of FIGS. 4-6, is such that, in each position, the reflections at $T_1$-$T_4$ are substantially self-cancelling. This is accomplished by designing the compensating section of the connector, such that in each of the positions, shown in FIGS. 4-6, the sum total of the reflected signals, that is considering both the magnitude and phase angle, are substantially self-cancelling that is to say, the characteristic impedances effect a total impedance for the connection substantially equal to the nominal impedance of the circuit. The dimensions provided above have provided such a result. The wavy lines of the curves of FIGS. 7-9 represent the VSWR (along the vertical axis) versus frequency in Gigahertz (along the horizontal), where the curves of FIGS. 7-9 correspond to the respective positions of the facing surfaces of panels 22,170 with respect to each other in FIGS. 4-6.

Advantageously then, the transmitted power is maintained at a relatively high level. For example, as shown in FIG. 7, which corresponds to the gap G equal to 0.005 inches, the maximum VSWR is 1.194 which translates to transmitted power of 99.2% of the input signal with a 0.8% reflected signal. As shown in FIG. 8, where the gap G equals 0.020 inches and is the nominal position, the maximum VSWR is equal to 1.081, which corresponds to 99.9 percent of the signal transmitted, whereas only 0.1 percent of the input signal is reflected. Finally, the maximum VSWR shown in FIG. 9 is 1.184 which corresponds to 99.3 percent of the input signal being transmitted.

Figure 7:
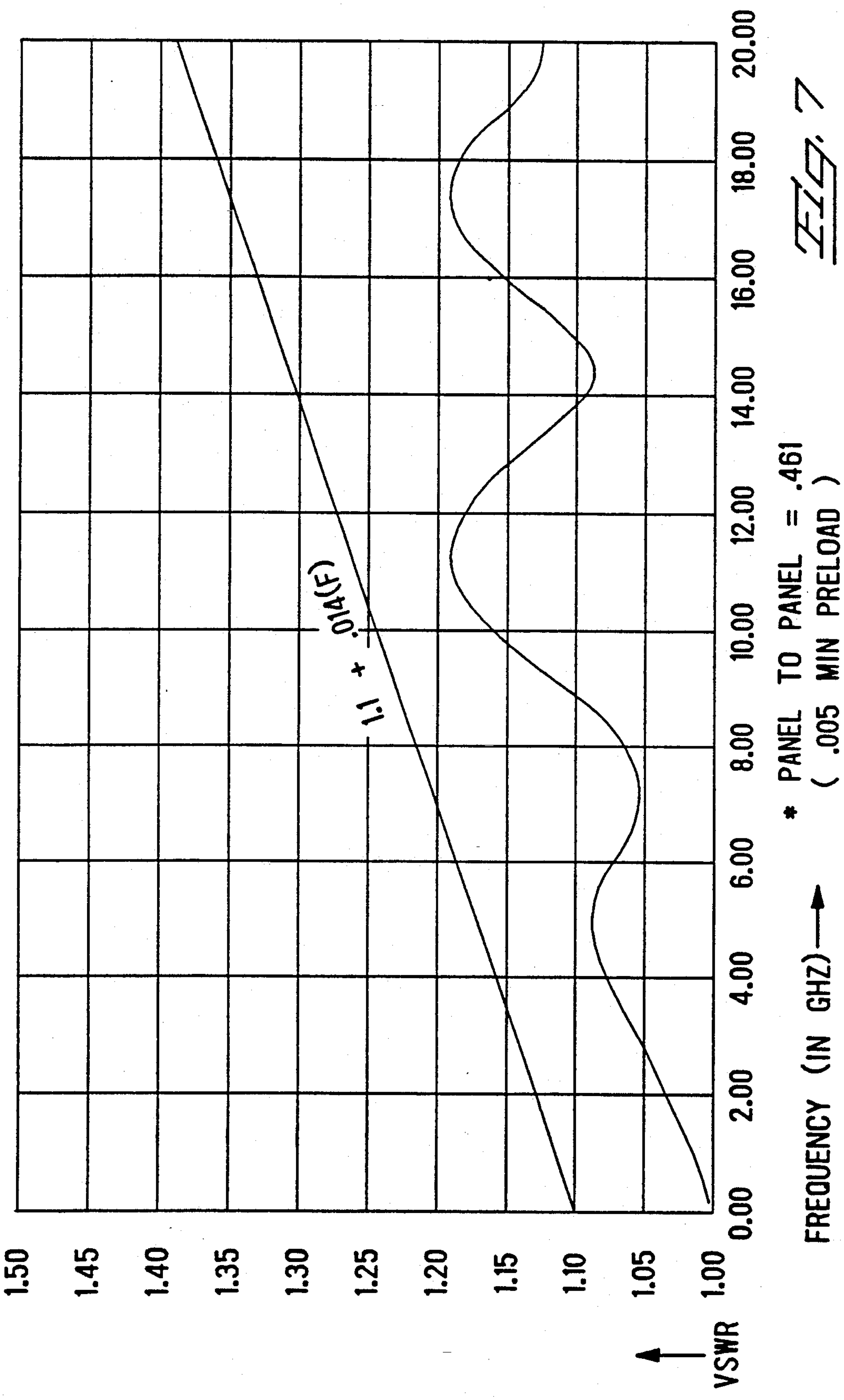
FIG. 7 is a graph of the VSWR versus frequency in Gigahertz for the mated position of FIG. 4.
Figure 8:
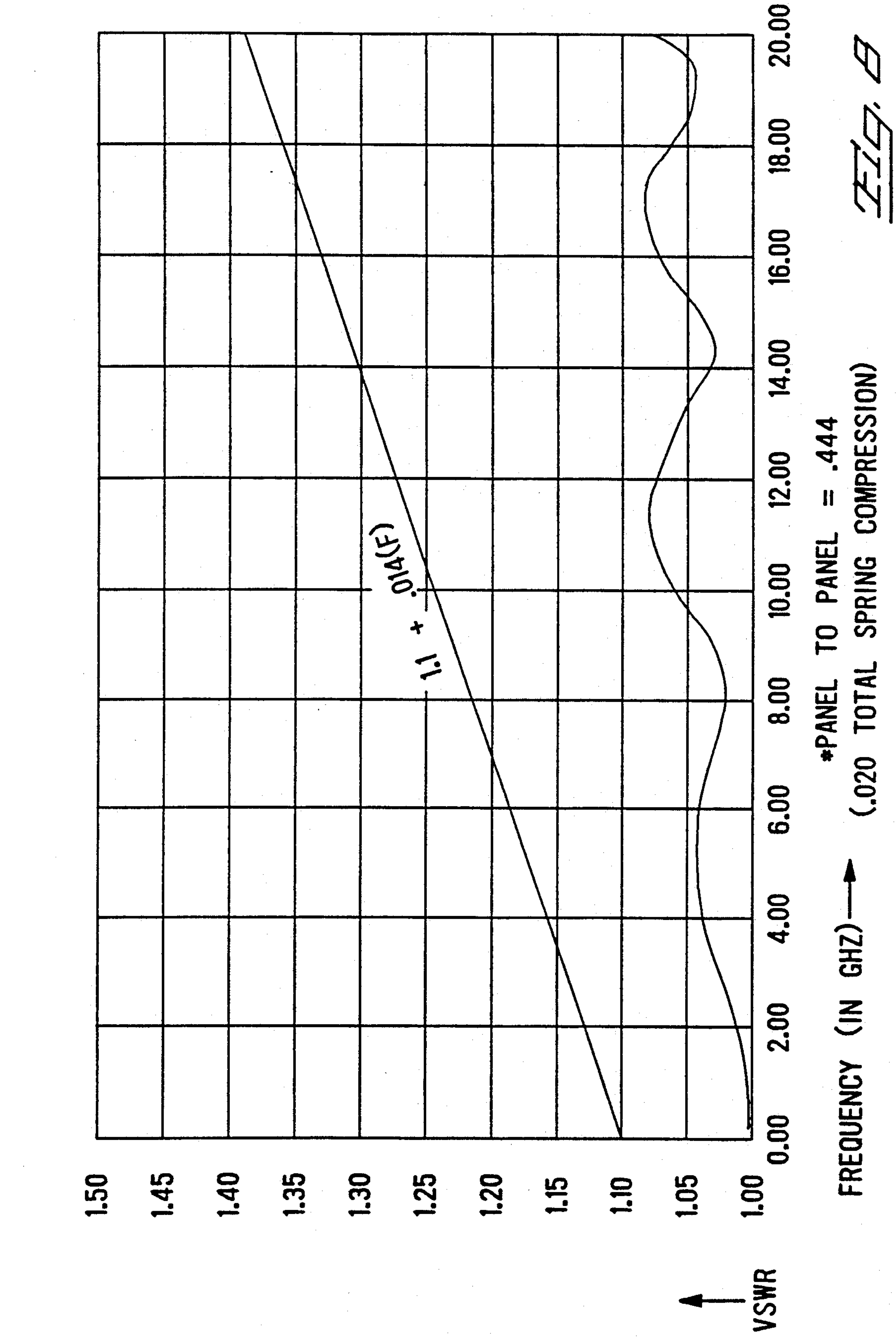
FIG. 8 is a graph of the VSWR versus frequency in Gigahertz for the mated position of FIG. 5.
Figure 9:
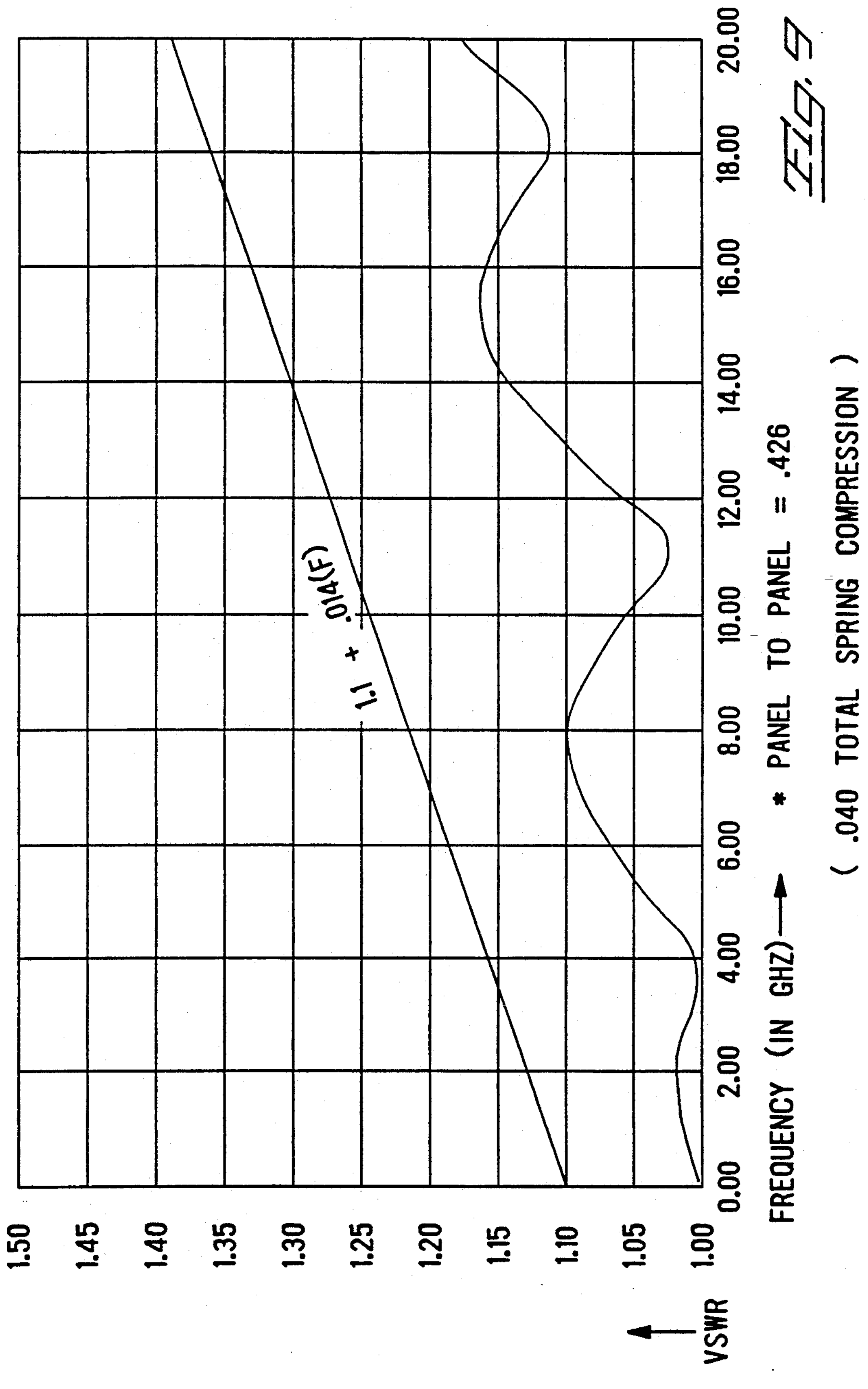
FIG. 9 is a graph of the VSWR versus frequency in Gigahertz for the mated position of FIG. 6.

The straight line graph in FIGS. 7-9 is a graphic representation of the formula $\text{Max VSWR} = 1.1 + (0.014 \times F)$ where $F$ = frequency in Gigahertz This formula has been generated for the standard 2.8 mm coaxial connector series for maximum VSWR. It should be appreciated that the inventive connector exceeds this performance at every frequency and in every position.

Thus, as shown in FIG. 1, the above-described coaxial connection allows the pin 142 to be fixedly mounted to the dielectric member 120, while at the same time be fixed relative to panel 170. The pin 23 and the associated pin 16 are also fixed relative to the associated panel 22. Rather than allowing the pin 16 and socket 142 to axially float to accommodate for any axial tolerances or misalignments, the self-compensating section was specifically designed to allow for internal flotation between the two panels. This allows the pin 16 and socket portion 146 (FIG. 3) to be mated perfectly, for example, as shown in FIGS. 4-6, so that there is no power loss at that electrical interface. Advantageously, any necessary flotation is taken up by the pin 142 and socket 140, and this flotation has been specifically designed so that there is minimal reflected signal resulting in power loss.

While the form of apparatus herein described constitute a preferred embodiment of this invention, it is to be understood that the invention is not limited to this precise form of apparatus, and that changes may be made therein without departing from the scope of the invention which is defined in the appended claims.

What is claimed is:

1. A coaxial connection within a connector assembly adapted to be mated at a mating face with a mating coaxial connector in a coaxial circuit having a nominal impedance, the coaxial connection comprising a pin terminal and a socket terminal where the pin terminal includes a pin contact section and a body section and is mounted by a dielectric body coaxially within an outer conductor, and where said socket terminal includes a socket contact section and is held within an outer conductive sleeve by way of a dielectric sleeve, the outer conductive sleeve including a conductive shroud section having a leading end coaxially engaged with and within said outer conductor with the conductive shroud and the outer conductor defining an outer conductive inner surface coextending along the mated pin and socket terminals, said pin terminal being coaxially positioned within said outer conductive inner surface and extending into said socket contact section, all defining a coaxial connection within a connector assembly, said coaxial connection characterized in that;

said pin terminal and said dielectric body and said outer conductor define a first subassembly, and said socket terminal and said dielectric sleeve and said conductive sleeve define a second subassembly, and said second subassembly is axially movable relative to said first subassembly upon said connector assembly being mated with a mating coaxial connector at said mating face, such that leading ends of said socket terminal and said conductive sleeve are movable axially with respect to said pin terminal and said outer conductor at an internal mated interface to respective particular axial positions ultimately resulting from relative movement of said first and second subassemblies upon mating of the connector assembly with the mating coaxial connector;

said pin terminal includes therealong an intermediate section between said pin contact section and said body section, said intermediate section and said pin contact section having different respective diameters defining at least one change in diameter axially located between said dielectric body and said socket contact section and within said conductive shroud section, and at least one change in diameter is defined along the outer conductive inner surface effected at said leading end of said conductive shroud section; and said at least one change in diameter of said pin terminal and said at least one change in diameter of said outer conductive inner surface being located to be staggered axially from each other at all possible particular ultimate axial positions;

said staggered changes in diameter defining various regions of mismatched impedances intermediate said dielectric body and said dielectric sleeve, said regions having respective lengths and axial limits which are defined by axial locations of intersections of all said changes in diameter of said pin terminal and said outer conductive inner surface with said axial locations of said intersections defining transition positions between said regions, whereby said diameters and said axial limits have respective dimensions and locations such that said regions create certain characteristic impedances respectively differing from each other and from the nominal impedance of the coaxial circuit completed by the mating of the connector assembly with the mating coaxial connector during signal transmission therealong in such a way as to effect a total impedance substantially equal to said nominal impedance irrespective of said ultimate axial position of said pin terminal with respect to that of said socket terminal resulting from mating of the connector assembly with a mating coaxial connector, thereby preventing power loss.

2. The connection of claim 1, characterized in that said pin contact section has a diameter less than said diameter of said intermediate section.

3. The connection of claim 2, characterized in that said intersection between said intermediate and pin contact sections is positioned within said conductive shroud.

4. The connection of claim 1, characterized in that said connection has three regions of mismatched impedances.

5. The connection of claim 4, characterized in that a first region is defined by a first portion of said intermediate section within said outer conductor, between an end of said conductive shroud and said dielectric body.

6. The connection of claim 5, characterized in that a second region of mismatched impedance is defined by a second portion of said intermediate section within said conductive shroud, between and end of said conductive shroud and said intersection.

7. The connection of claim 6, characterized in that a third region is defined by a length of said pin contact section within said conductive shroud, between said intersection and said dielectric sleeve.

8. An impedance balanced floating coaxial connector to be affixed at a mounting face to an electrical article and having a mating face enabling mating of the coaxial connector with a complementary coaxial connector associated with said electrical article to complete a coaxial circuit having a nominal impedance, comprising;

a first subassembly including an outer conductive member, a dielectric pin retaining member and a cylindrical pin terminal, and a second subassembly including a conductive sleeve, a dielectric member and a socket terminal;

said conductive sleeve having a first end at said mating face, and a conductive shroud section disposed at an opposed second end and extending therefrom to a leading end;

said dielectric member being positioned within said conductive sleeve, said dielectric member having opposing end faces at corresponding opposing ends thereof and a terminal passageway extending between said opposing end faces, the dielectric member being positioned within the conductive sleeve such that one of said end faces is spaced recessed axially from said shroud leading end;

said socket terminal being positioned within said terminal passageway, having at least a first socket portion adjacent to said one of said end faces of said dielectric member;

said second outer conductive member being adjacent said mounting face at a second end thereof and having a conductive ring proximate a shroud-receiving first end thereof within which said leading end of said conductive shroud section is disposed in electrical engagement therewith together defining an outer conductive inner surface;

said dielectric pin retaining member being affixed within said outer conductive member proximate said mounting face and having a pin receiving aperture therethrough from a first end to a second end recessed axially from said shroud-receiving end of said conductive ring;

said cylindrical pin terminal being secured within said pin receiving aperture of said dielectric pin retaining member and having a pin contact section extending to a free end from said second end of said dielectric pin retaining member extending into said first socket portion of said socket terminal and slidable therewithin and disposed concentrically within said conductive ring, said pin terminal having an intermediate section between said pin contact section and a body section, said intermediate section having a first diameter extending beyond said second end of said dielectric pin retaining member, and said pin contact section having a second diameter extending from an intersection with said intermediate section to said free end of said pin contact section and being in mated engagement with said first socket portion, a change in diameter at said intersection of said intermediate and pin contact sections being positioned within said conductive shroud section;

said second subassembly being axially movable with respect to said first subassembly during mating of the connector assembly with the mating coaxial connector such that leading ends of said socket terminal and said conductive sleeve are movable axially with respect to said pin terminal and said conductive ring at an internal mated interface to respective particular axial positions ultimately resulting from mating of the connector assembly with the mating coaxial connector;

at least one change in diameter being defined along the outer conductive inner surface effected at said shroud leading end; and said at least one change in diameter of said pin terminal and said at least one change in diameter of said outer conductive inner surface being located to be staggered axially from each other at all possible particular ultimate axial positions;

said staggered changes in diameter defining a plurality of regions of mismatched impedance along the length of said pin member between said dielectric member and said dielectric pin retaining member, said regions having respective lengths and axial limits which are defined by axial locations of said intersections of all changes in diameter of said pin terminal and said outer conductive inner surface, whereby said diameters and said axial limits have respective dimensions and locations such that said regions create certain characteristics impedances respectively differing from each other and from the nominal impedance of the coaxial circuit completed by the mating of the connector assembly with the mating coaxial connector in such a way as to effect a total impedance substantially equal to said nominal impedance irrespective of said axial position of said pin terminal with respect to said signal terminal resulting from mating, thereby preventing power loss.

9. The connector of claim 8, wherein said socket terminal includes a mating portion at an end opposite said first socket portion and exposed at said mating face, and said socket terminal and pin member are relatively axially movable thereby enabling axial flotation of said mating portion at said mating face upon mating of said coaxial connector with a mating coaxial connector.

10. The connector of claim 9, wherein said mating portion is a second socket portion at an opposite end of said socket terminal.

11. The connector of claim 8, wherein said conductive sleeve includes an outer conductive shroud having resilient fingers, said outer conductive shroud coaxially surrounding said mating portion.

12. The connector of claim 8, wherein said conductive shroud section has resilient fingers extending to respective leading ends defining said shroud leading end.

13. The connector of claim 8, wherein said connector further includes a spring member disposed between said first and second subassemblies whereby said first subassembly and said second subassembly are movable together under spring loading upon mating of the RF coaxial connector with a mating coaxial connector.

14. An RF coaxial connector to be affixed at a mounting face to an electrical article and having a mating face enabling mating of the RF coaxial connector to a complementary coaxial connector associated with said electrical article, comprising;

a conductive member having inner and outer conductive shrouds at opposite ends of a conductive tubular section, each said conductive shroud being integrally connected to said tubular section with said outer conductive shroud extending to said mating face of the connector, and said inner conductive shroud extending to a leading end at an internal mated interface;

a dielectric sleeve inserted within said conductive member, said sleeve comprising at tubular body disposed within said conductive tubular member, said sleeve having opposed first and second end faces, said first end face recessed from said internal mated interface thereby defining an annular opening within said inner conductive shroud intermediate said first end face and said internal mated interface, said dielectric sleeve further comprising an inner passageway extending between said opposed end faces;

an electrical socket terminal secured in said passageway, said terminal comprising an inner socket portion positioned adjacent to said first end face of said dielectric member, and an outer socket member positioned coaxially of said outer conductive shroud adjacent said connector mating face;

a conductive sleeve having a first end disposed adjacent said connector mounting face and including an opposed shroud-receiving second end coextending around said inner conductive shroud and in slidable engagement therewith at said internal mated interface; and an electrical pin terminal having a body section mounted in a dielectric sleeve secured within said conductive sleeve, said pin terminal being cylindrical and further having a pin contact section and an intermediate section between said body section and said pin contact section, said intermediate section having a first diameter extending toward said socket terminal from a socket-proximate end face of said dielectric sleeve, and said pin contact section extending from an intersection with said intermediate section and having a second diameter less than said first diameter and mated with and slidable within said inner socket portion, said intersection and said pin contact section being coaxially positioned within said inner conductive shroud with said intersection and adjacent portions of said intermediate and pin contact sections disposed within said annular opening, and a remaining portion of said intermediate section disposed within said conductive sleeve, said conductive member and said socket terminal being axially movable during mating of the RF coaxial connector with the complementary coaxial connector relative to said conductive sleeve and said electrical pin terminal at said internal mated interface thereby moving said intersection relative to said inner conductive shroud, whereby said pin terminal and said conductive sleeve can remain in a fixed axial position affixed to said electrical article at said mounting face while said connector mating face is axially movable to accommodate a range of mated positions of the RF coaxial connector with the complementary coaxial connector thereat.

15. The RF coaxial connector of claim 14, wherein, during mating of the RF coaxial connector with the complementary coaxial connector to complete a coaxial circuit, axial movement of said socket terminal and said conductive member with respect to said pin terminal and said conductive sleeve results in movement of all changes in diameter of the pin terminal with respect to those of said outer conductive inner surface, said changes in diameter being prelocated axially within axial limits to be staggered and the axial limits define regions, and said diameters and said axial limits of said regions have respective dimensions and locations such that said regions create certain characteristic impedances respectively differing from each other and from the nominal impedance of the coaxial circuit in such a way as to effect a total impedance substantially equal to said nominal impedance irrespective of said axial position of said pin terminal with respect to that of said socket terminal resulting from mating of the RF coaxial connector and the complementary coaxial connector, thereby preventing power loss.

16. The RF coaxial connector of claim 15 wherein four reflective signals are caused at four various impedance transition sections.

17. The RF coaxial connector of claim 14, further comprising a conductive portion surrounding said dielectric sleeve and said conductive sleeve.

18. The RF coaxial connector of claim 14, further including a spring member therein between said conductive sleeve and said conductive member, whereby said conductive member, said dielectric sleeve and said socket terminal are spring loadably mounted relative to said conductive sleeve, said dielectric member and said pin terminal.

19. The RF coaxial connector of claim 18, wherein an outer conductive shroud is fixedly attached to said conductive sleeve seated within a flange portion thereof proximate said connector mating face, adjacent to and coextending along said first outer conductive shroud and securing said conductive member to said conductive sleeve in movable relationship therewith, and a spring retaining cap affixed to said first outer conductive shroud at said connector mating face, said cap trapping said spring member intermediate itself and said outer conductive shroud, whereby said socket terminal is spring loadably movable to vary the axial position of said pin member relative to said socket member during mating of the RF coaxial connector with a mating coaxial connector.

* * * * *